United States Patent
Chao et al.

(10) Patent No.: US 8,159,035 B2
(45) Date of Patent: Apr. 17, 2012

(54) METAL GATES OF PMOS DEVICES HAVING HIGH WORK FUNCTIONS

(75) Inventors: Donald Y. Chao, Hsin-Chu (TW);
Albert Chin, Hsin-Chu (TW);
Ping-Fang Hung, Hsin-Chu (TW);
Fong-Yu Yen, Taoyuan (TW);
Kang-Cheng Lin, Yonghe (TW);
Kuo-Tai Huang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 651 days.

(21) Appl. No.: 11/840,365

(22) Filed: Aug. 17, 2007

(65) Prior Publication Data

US 2009/0014813 A1 Jan. 15, 2009

Related U.S. Application Data

(60) Provisional application No. 60/948,646, filed on Jul. 9, 2007.

(51) Int. Cl.
*H01L 29/76* (2006.01)
*H01L 29/94* (2006.01)

(52) U.S. Cl. .................. 257/407; 257/412; 257/413

(58) Field of Classification Search .................. 257/407, 257/412, 413, E21.622, E21.636; 438/240, 438/655

See application file for complete search history.

(56) References Cited

U.S. PATENT DOCUMENTS

| 5,355,020 A * | 10/1994 | Lee et al. | 257/741 |
| 6,060,361 A * | 5/2000 | Lee | 438/283 |
| 6,103,606 A * | 8/2000 | Wu et al. | 438/586 |
| 7,101,753 B2 * | 9/2006 | Kamiyama et al. | 438/240 |
| 7,282,443 B2 * | 10/2007 | Hu | 438/655 |
| 2002/0006722 A1 | 1/2002 | Thakur | |
| 2004/0051123 A1* | 3/2004 | Rhodes | 257/215 |
| 2004/0080001 A1 | 4/2004 | Takeuchi | |
| 2005/0199963 A1 | 9/2005 | Aoyama | |
| 2006/0091474 A1 | 5/2006 | Nabatame et al. | |

FOREIGN PATENT DOCUMENTS

KR 100261150 B1 9/2000

OTHER PUBLICATIONS

Wu, C.H., et al., "High Temperature Stable [Ir3Si-TaN]/HfLaON CMOS with Large Work-Function Difference," Electron Devices Meeting, Dec. 2006, 4 pp., IEEE.
Yu, D.S., et al., "Lanthanide and Ir-based Dual Metal-Gate/HfAION CMOS with Large Work-Function Difference," Electron Devices Meeting, Dec. 2005, IEDM Technical Digest, 4 pp., IEEE.

* cited by examiner

*Primary Examiner* — Hung Vu
(74) *Attorney, Agent, or Firm* — Slater & Matsil, L.L.P.

(57) ABSTRACT

A semiconductor structure includes a refractory metal silicide layer; a silicon-rich refractory metal silicide layer on the refractory metal silicide layer; and a metal-rich refractory metal silicide layer on the silicon-rich refractory metal silicide layer. The refractory metal silicide layer, the silicon-rich refractory metal silicide layer and the metal-rich refractory metal silicide layer include same refractory metals. The semiconductor structure forms a portion of a gate electrode of a metal-oxide-semiconductor device.

20 Claims, 4 Drawing Sheets

METAL GATES OF PMOS DEVICES HAVING HIGH WORK FUNCTIONS

This application claims the benefit of U.S. Provisional Application No. 60/948,646, filed on Jul. 9, 2007, entitled "Metal Gates of PMOS Devices Having High Work Functions," which application is hereby incorporated herein by reference.

TECHNICAL FIELD

This invention relates generally to semiconductor devices, and more particularly to structures of metal-oxide-semiconductor (MOS) devices and manufacturing methods for forming the same, and even more particularly to the formation of gate electrodes of p-type MOS devices.

BACKGROUND

Metal-oxide-semiconductor (MOS) devices are basic building elements in integrated circuits. A conventional MOS device typically has a gate electrode comprising polysilicon doped with p-type or n-type impurities, using doping operations such as ion implantation or thermal diffusion. It is preferable to adjust the work function of the gate electrode to the band-edge of the silicon; that is, for an NMOS device, adjusting the work function close to the conduction band, and for a PMOS device, adjusting the work function close to the valence band. Adjusting the work function of the polysilicon gate electrode can be achieved by selecting appropriate impurities.

MOS devices with polysilicon gate electrodes exhibit carrier depletion effect, which is also referred to as a poly depletion effect. The poly depletion effect occurs when applied electrical fields sweep away carriers from regions close to gate dielectrics, forming depletion layers. In an n-doped polysilicon layer, the depletion layer includes ionized non-mobile donor sites, whereas in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The use of thin gate dielectrics tends to make the carrier depletion effect worse. With thin gate dielectrics, the depletion layer in the polysilicon gate becomes more significant in thickness when compared to the thickness of the thin gate dielectrics, and thus device performance degradation suffers. As a result, the carrier depletion effect in the gate electrodes limits device scalability by imposing a lower bound on how much the effective gate dielectric thickness can be reduced.

A further problem is that with the thin gate oxides, gate leakage currents are increased. Therefore, high-k dielectrics are used to reduce gate leakage currents. However, high-k dielectric materials are not compatible with polysilicon gates due to Fermi level pinning.

The poly depletion effects and high-k incompatibility problems may be solved by forming metal gate electrodes or metal silicide gate electrodes, wherein preferably, the metallic gates used in NMOS devices and PMOS devices also have band-edge work functions. Currently, materials suitable for forming gate electrodes of NMOS devices have been found. However, for PMOS devices, even though metallic materials having band-edge work functions are available, these materials have poor thermal stability. When exposed to the high temperatures of the front-end-of-line processes, the work functions of these metallic materials shift, for example, toward the mid-gap level. The performance of the resulting PMOS devices is thus adversely affected. In addition, after exposed to the high temperatures, the capacitance-equivalent-thickness (CET) of these high-work-function metals becomes higher than that of the metals having low work functions.

Iridium and platinum are among the most promising metals with high work functions. However, platinum is not process friendly, and it is hard to pattern a platinum layer as a gate using conventional reactive ion etch (RIE). Iridium, on the other hand, is process friendly. However, it has been found that a pure iridium gate exhibits serious diffusion problem, wherein iridium penetrates through high-k materials after 1000° C. rapid thermal activation.

Accordingly, what is needed in the art is a semiconductor structure and respective formation methods that take advantage of the benefits associated with band-edge work functions while at the same time overcoming the deficiencies of the prior art.

SUMMARY OF THE INVENTION

In accordance with one aspect of the present invention, a semiconductor structure includes a refractory metal silicide layer; a silicon-rich refractory metal silicide layer on the refractory metal silicide layer; and a metal-rich refractory metal silicide layer on the silicon-rich refractory metal silicide layer. The refractory metal silicide layer, the silicon-rich refractory metal silicide layer and the metal-rich refractory metal silicide layer include same refractory metals.

In accordance with another aspect of the present invention, a semiconductor structure includes a substrate; a gate dielectric over the substrate; a refractory metal silicide layer over the gate dielectric; and a silicon-rich refractory metal silicide layer on the refractory metal silicide layer. The refractory metal silicide layer and the silicon-rich refractory metal silicide layer include same refractory metals.

In accordance with yet another aspect of the present invention, a semiconductor structure includes a substrate; a gate dielectric over the substrate; and a laminated iridium silicide layer. The laminated iridium silicide layer includes an iridium silicide layer over the gate dielectric; a silicon-rich iridium silicide layer on the iridium silicide layer; and an iridium-rich iridium silicide layer on the silicon-rich iridium silicide layer. The semiconductor structure further includes a polysilicon layer over the iridium-rich iridium silicide layer; a gate spacer on sidewalls of the laminated iridium silicide layer and the polysilicon layer; and a p-type source/drain region in the semiconductor substrate and adjacent the gate dielectric.

In accordance with yet another aspect of the present invention, a method of forming a semiconductor structure includes forming a refractory metal silicide layer; forming a silicon-rich refractory metal silicide layer on the refractory metal silicide layer; and forming a metal-rich refractory metal silicide layer on the silicon-rich refractory metal silicide layer. The refractory metal silicide layer, the silicon-rich refractory metal silicide layer and the metal-rich refractory metal silicide layer include same refractory metals.

In accordance with yet another aspect of the present invention, a method of forming a semiconductor structure includes providing a substrate; forming a gate dielectric over the substrate; forming a refractory metal silicide layer over the gate dielectric; and forming a silicon-rich refractory metal silicide layer on the refractory metal silicide layer.

In accordance with yet another aspect of the present invention, a method for forming a semiconductor structure includes providing a substrate; forming a high-k gate dielectric over the substrate; and forming a laminated iridium silicide layer including forming an iridium silicide layer over the high-k gate dielectric; forming a silicon-rich iridium silicide layer on the iridium silicide layer; and forming an iridium-rich iridium silicide layer on the silicon-rich iridium silicide layer. The method further includes forming a polysilicon layer over the iridium-rich iridium silicide layer; forming a gate spacer on sidewalls of the laminated iridium silicide layer and the polysilicon layer; and forming a source/drain region in the semiconductor substrate and adjacent the high-k gate dielectric.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A metal-oxide-semiconductor (MOS) device having a laminated gate structure and methods for forming the same are provided by the present invention. The intermediate stages of manufacturing preferred embodiments of the present invention are illustrated. Throughout the various views and illustrative embodiments of the present invention, like reference numbers are used to designate like elements.

Figure 1:
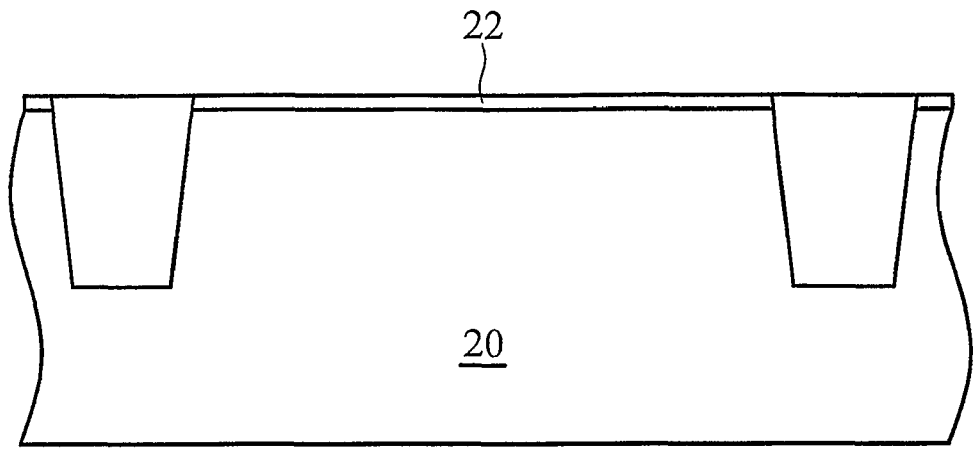
FIGS. 1 through 6 are cross-sectional views of intermediate stages in the manufacturing of embodiments of the present invention.

Referring to FIG. 1, substrate 20, which is preferably a silicon substrate, is provided. Substrate 20 may also comprise other silicon-containing semiconductor materials such as silicon germanium. In addition, substrate 20 may be in the form of bulk semiconductor, strained semiconductor, compound semiconductor, semiconductor-on-insulator (SOI), and the like. Shallow trench isolation (STI) regions are formed in substrate 20, preferably by etching shallow trenches in substrate 20 and filling the trenches with an insulator such as silicon oxide.

Interfacial layer 22 is formed on substrate 20. Interfacial layer 22 preferably has a thickness of less than about 10 Å, and may include chemical silicon oxide, which is preferably formed of chemical reactions, or UV-$O_3$ silicon oxide, which is formed by exposing substrate 20 to ultra violet light in an ozone-containing environment. Alternatively, interfacial layer 22 may include silicon oxynitride, silicon nitride, and the like. One skilled in the art will realize the respective formation processes.

Figure 2:
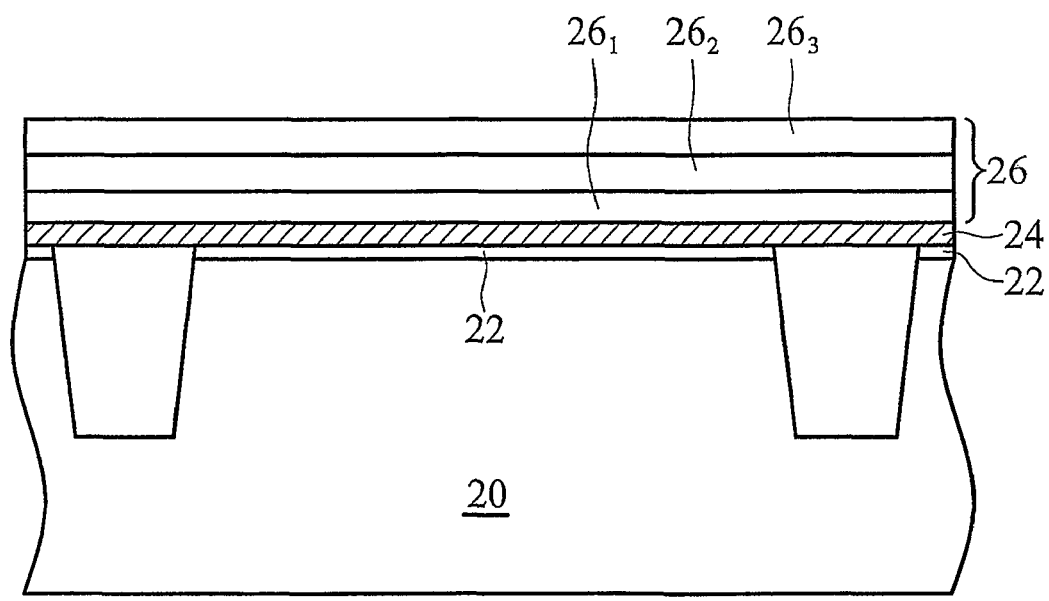

FIG. 2 illustrates the formation of gate dielectric layer 24 and laminated metal silicide layer 26. In an embodiment, gate dielectric layer 24 includes silicon oxide. In other embodiments, gate dielectric layer 24 includes dielectric materials having high dielectric constants (k value), for example, greater than about 3.9. The applicable materials include silicon nitrides, silicon oxynitrides, $HfO_2$, $HfZrO_x$, $HfSiO_x$, $HfSiO_x$, $HfTiON$, $Al_2O_3$, $HfAlO_x$, $ZrO_2$, $HfZrO$, $HfZrON$, $HfTaO$, $HfSiON$, $HfAlON$, $HfTaTiO$, and the like, combinations thereof, and multi-layers thereof. The preferred thickness ranges between about 10 Å and about 100 Å. The formation methods include commonly used methods such as atomic layer deposition (ALD), chemical vapor deposition (CVD), metal organic chemical vapor deposition (MOCVD), physical vapor deposition (PVD), and the like. Nitrogen, if desirable, can be incorporated into gate dielectric layer 24 by plasma nitridation or thermal nitridation, wherein nitrogen percentage is preferably less than about 30 percent.

After the deposition of gate dielectric layer 24, a post-deposition annealing is performed. In an exemplary embodiment, the post-deposition annealing is performed in an ambient containing $N_2$, $O_2$, $H_2$, $D_2$, $NH_3$, inert gas and combinations thereof. Carrier gases such as argon may also be included. The post-deposition annealing temperature is preferably between about 400° C. and about 1200° C.

Next, a laminated metal silicide layer 26 is deposited. In the preferred embodiment, the laminated metal silicide layer 26 includes iridium silicide layer $26_1$, silicon-rich iridium silicide layer $26_2$ on iridium silicide layer $26_1$, and iridium-rich iridium silicide layer $26_3$ on silicon-rich iridium silicide layer $26_2$. The deposition methods include commonly used methods such as PVD, ALD, MOCVD, sputtering, and the like. In an exemplary embodiment, the deposition method is PVD, which is performed using an iridium target and a silicon target, and the compositions of iridium silicide layers $26_1$, $26_2$ and $26_3$ are tuned by adjusting a power ratio of a power applied on the iridium target and a power applied on the silicon target. In alternative embodiments, iridium silicide layers $26_1$, $26_2$ and $26_3$ are formed by sputtering from an iridium silicide target(s), wherein the different compositions of iridium silicide layers $26_1$, $26_2$ and $26_3$ are achieved by using different iridium silicide target with different compositions, and/or by adjusting power settings.

Each of the layers $26_1$, $26_2$ and $26_3$ has a preferred thickness of between about 10 Å and about 100 Å, and a combined thickness of iridium silicide layers $26_1$, $26_2$ and $26_3$ is preferably between about 50 Å and about 300 Å. An atomic ratio of the number of iridium atoms to the number of silicon atoms in iridium silicide layer $26_1$ is preferably between about 0.5 and about 1.5. The atomic percentage of silicon in the silicon-rich iridium silicide layer $26_2$ is preferably greater than about 70 percent, wherein the atomic percentage of silicon is calculated as the number of silicon atoms divided by the number of silicon and iridium atoms. The atomic percentage of iridium in the iridium-rich iridium silicide layer $26_3$ is preferably greater than about 70 percent, wherein the atomic percentage of iridium is calculated as the number of iridium atoms divided by the number of silicon and iridium atoms. In alternative embodiments, only iridium silicide layer $26_1$ and the silicon-rich iridium silicide layer $26_2$ are formed, while the iridium-rich iridium silicide layer $26_3$ is omitted.

In the preferred embodiment, metal silicide layer 26 is a laminated iridium silicide layer. In alternative embodiments, metal silicide layer 26 includes laminated silicide layer of other refractory metals, such as molybdenum silicide, tungsten silicide, rhenium silicide, tantalum silicide, platinum silicide, and combinations thereof. Preferably, the refractory metals in the laminated structure have similar atomic percentage ratios as iridium silicide layers $26_1$, $26_2$ and $26_3$.

Figure 3:
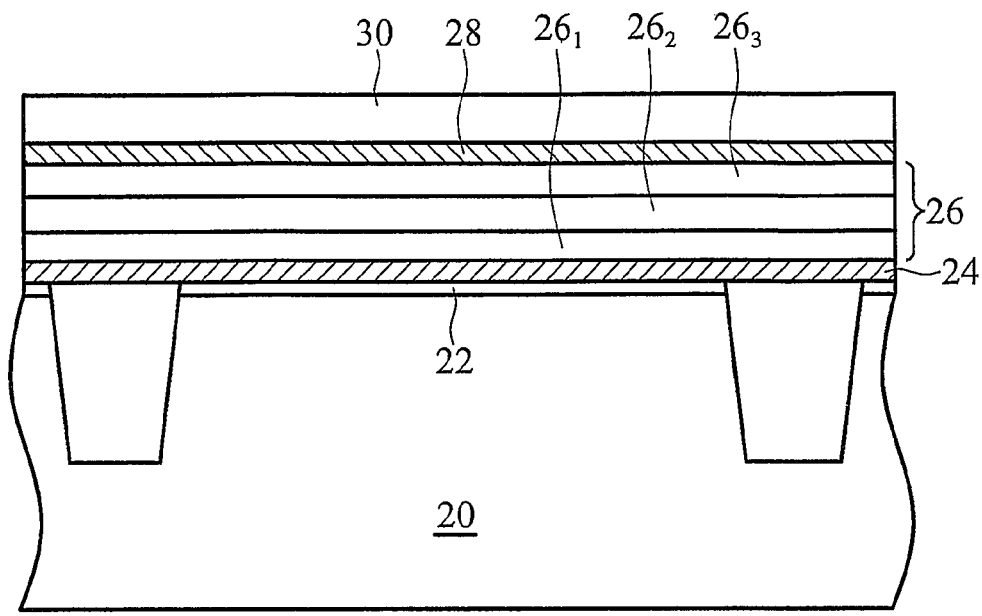

Referring to FIG. 3, cap layer 28 and polysilicon layer 30 are formed. Cap layer 28 may include Mo, TaN, TiN, TaSiN, TaC, and combinations thereof, and has the function of preventing the oxidation of iridium silicide layer 26. The thickness of cap layer 28 is preferably between about 10 Å and about 100 Å.

Polysilicon layer 30 may have a thickness of between about 400 Å and about 1500 Å. The functions of polysilicon layer 30 include preventing contamination of metal layer 26, and maintaining the height of the gate stack to a level compatible with the existing integrated circuit manufacturing processes.

Figure 4:
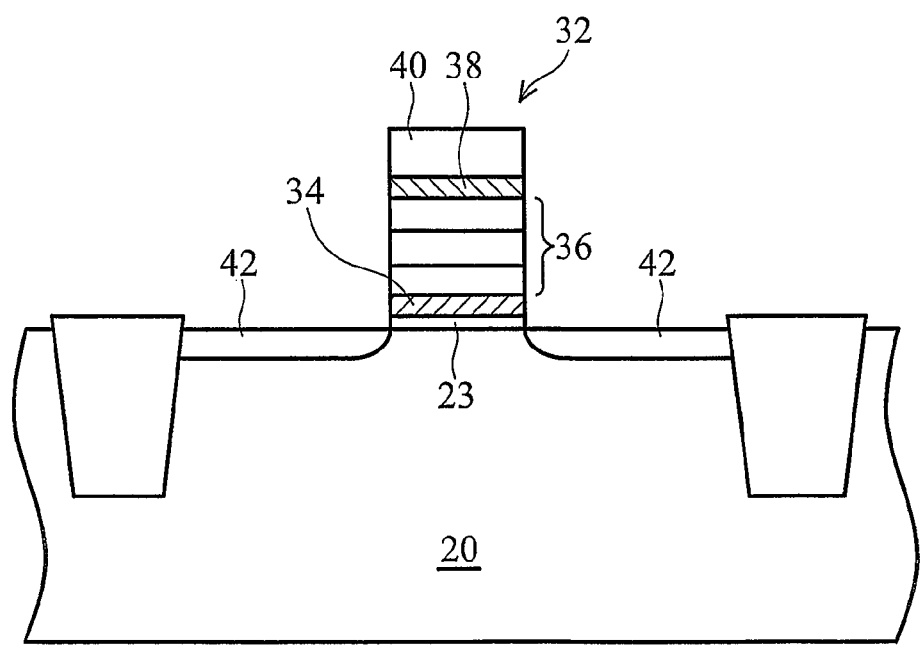

Referring the FIG. 4, the stacked layers are patterned, forming gate stack 32, which includes gate dielectric 34, laminated metal silicide layer 36, cap layer 38, and polysilicon layer 40. In the preferred embodiment, the patterning is performed using reactive ion etching (RIE), although other commonly used patterning method can also be used. A portion 23 of the interfacial layer 22 remains after the patterning. Next, lightly doped source/drain (LDD) regions 42 are formed, preferably by implanting a p-type impurity, such as boron, into semiconductor substrate 20.

Figure 5:
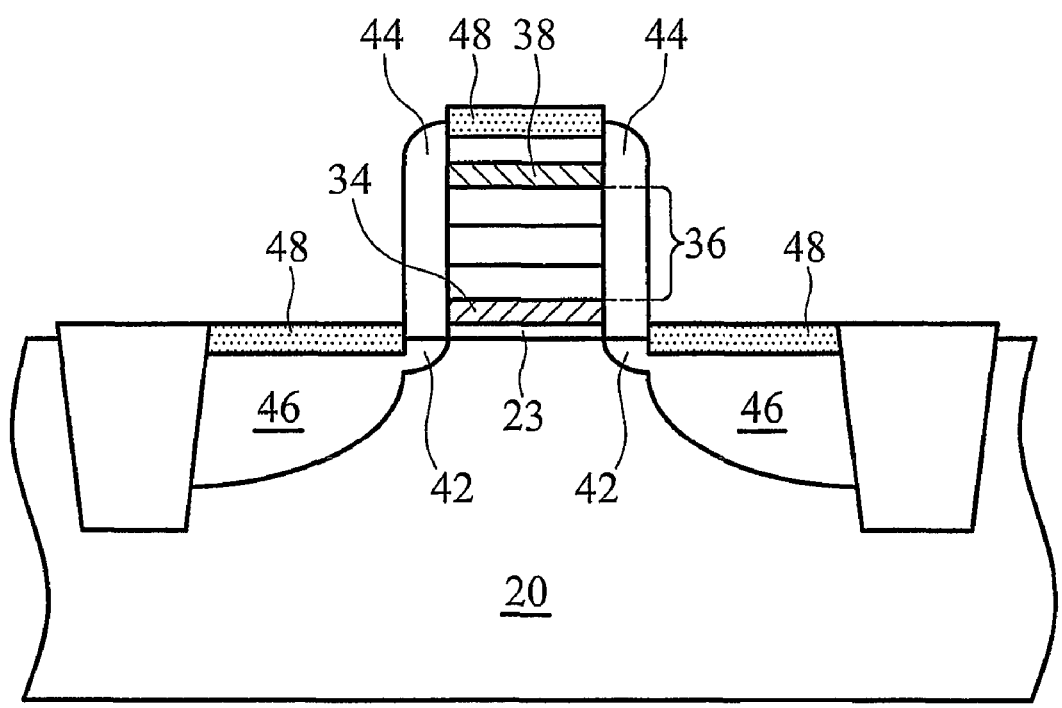

FIG. 5 illustrates the formation of the remaining components of a p-type MOS (PMOS) device, which include gate spacers 44 and source/drain regions 46. Gate spacers 44 can be formed by blanket depositing a dielectric layer, such as silicon nitride, and then etching undesired portions. Gate spacers 44 may also have a composite structure, for example, a nitride-on-oxide structure or an oxide-nitride-oxide (ONO) structure.

Source/drain regions 46 and silicide regions 48 are then formed. In the preferred embodiment, source/drain regions 46 are formed by implanting a p-type impurity, such as boron and/or indium, into semiconductor substrate 20, wherein gate spacers 44 are used as a mask during the implantation, so that the edges of the source/drain regions 46 are substantially aligned with the respective gate spacers 44. The formation of source/drain regions 46 may also include recessing substrate 20 and epitaxially growing semiconductor materials, such as silicon germanium, in the recesses. To form silicide regions 48, a thin metal layer (not shown), such as cobalt, nickel, platinum, and combinations thereof, is first formed over the device. The device is then annealed to form silicide regions 48 between the deposited metal and the underlying silicon regions. The un-reacted metal layer is then removed.

Figure 6:
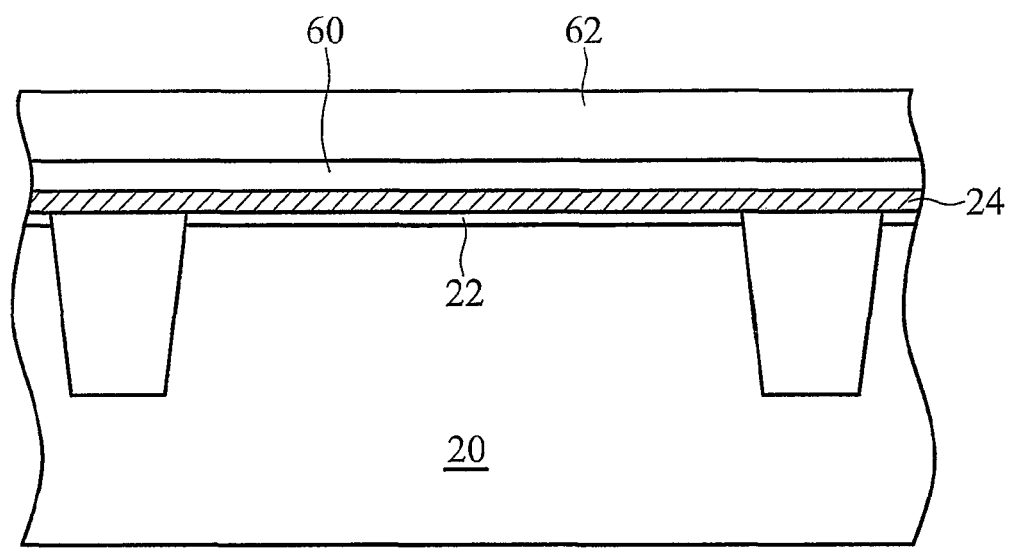

A variation of the preferred embodiment is shown in FIG. 6. The initial stage of this embodiment is essentially the same as shown in FIG. 1. Next, as shown in FIG. 6, amorphous silicon layer 60 is formed. In the preferred embodiment, amorphous silicon layer 60 has a thickness of between about 50 Å and about 500 Å, and more preferably between about 50 Å and about 100 Å. Refractory metal layer 62 is then deposited on amorphous silicon layer 60. In the preferred embodiment, refractory metal layer 62 is formed of iridium. In alternative embodiments, refractory metal layer 62 includes iridium, molybdenum, tungsten, rhenium, tantalum, platinum, and combinations thereof. In yet other embodiments, refractory metal layer 62 may comprise metal silicides such as IrSi, $MoSi_2$, $WSi_2$, $ReSi/ReSi_2$, $TaSi_2$, PtSi, and the like. The thickness of refractory metal layer 62 is preferably between about 100 Å and about 500 Å.

Amorphous silicon layer 60 and refractory metal layer 62 are then annealed to incur a silicidation, resulting in a structure as shown in FIG. 2. The process conditions need to be carefully controlled in order to form the laminated silicide regions. In an exemplary embodiment, the annealing is a rapid thermal annealing (RTA), wherein the annealing temperature is preferably between about 400° C. and about 1200° C., and more preferably between about 800° C. and about 1100° C. The annealing duration is preferably between about 5 seconds and about 30 seconds, and more preferably between about 5 seconds and about 15 seconds. Further, the thicknesses of amorphous silicon layer 60 and refractory metal layer 62 affect the resulting silicide structure. In an exemplary embodiment, for the above discussed annealing temperature and duration, amorphous silicon layer 60 and refractory metal layer 62 preferably have thicknesses of about 50 Å and 200 Å, respectively. Under such process conditions, the laminated structure including iridium silicide layer $26_1$, silicon-rich iridium silicide layer $26_2$, and iridium-rich iridium silicide layer $26_3$, is formed.

In subsequent process steps, cap layer 28 and polysilicon layer 30 are deposited, forming a structure as shown in FIG. 3. The process is then continued to form the remaining components of the PMOS device, as shown in FIGS. 4 and 5.

One skilled in the art will realize that although the embodiments discussed in the preceding paragraphs are for forming PMOS devices, the teaching of the present invention is readily applicable to the formation of n-type MOS (NMOS) devices. Preferably, the NMOS device includes a band-edge metal gate having a low work function. The preferred metals include TaC, TaN, TaSiN, HfN, La, and combinations thereof, and may be deposited using PVD, ALD or MOCVD. The metal thickness ranges from about 1 nm to 30 nm. One skilled in the art will realize the corresponding formation steps.

The embodiments of the present invention have several advantageous features. It has been found that, even after the RTA process, the laminated iridium silicide layer has a flat band voltage of about 0.848V, indicating a work function of greater than about 5.0 eV. The combination of high-k dielectric materials and laminated silicide layer results in a reduced capacitance-equivalent-thickness (CET), which is even comparable to that of TaC on $HfO_2$. Iridium silicide exhibits a reduced diffusion, and no inter-diffusion between iridium silicide and high-k dielectric materials has been observed. In addition, in the resulting PMOS devices, the increase in the interfacial layer is negligible due to the reduced iridium diffusion.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a substrate;
   a gate dielectric of a metal-oxide-semiconductor (MOS) device over the substrate;
   a refractory metal silicide layer directly contacting the gate dielectric; and
   a silicon-rich refractory metal silicide layer on the refractory metal silicide layer, wherein the refractory metal silicide layer and the silicon-rich refractory metal silicide layer comprise the same refractory metals.

2. The semiconductor structure of claim 1 further comprising a metal-rich refractory metal silicide layer on the silicon-rich refractory metal silicide layer.

3. The semiconductor structure of claim 1 further comprising
a polysilicon layer over the silicon-rich refractory metal silicide layer.

4. The semiconductor structure of claim 3 further comprising a cap layer between the silicon-rich refractory metal silicide layer and the polysilicon layer.

5. The semiconductor structure of claim 1, wherein the refractory metals comprise iridium, molybdenum, tungsten, rhenium, tantalum, platinum, and combinations thereof.

6. The semiconductor structure of claim 1, wherein the refractory metals comprise iridium only.

7. The semiconductor structure of claim 1, wherein a silicon atomic percentage in the silicon-rich refractory metal silicide layer is greater than about 70 percent.

8. The semiconductor structure of claim 1, wherein the refractory metal silicide layer and the silicon-rich refractory metal silicide layer each have a thickness of between about 10 Å and about 100 Å.

9. The semiconductor structure of claim 1, wherein the gate dielectric comprises a high-k material comprising silicon nitride, silicon oxynitride, $HfO_2$, $HfZrO_x$, $HfSiO_x$, $HfSiO_x$, HfTiON, $Al_2O_3$, $HfAlO_x$, $ZrO_2$, HfZrO, HfZrON, HfTaO, HfTaTiO, and combinations thereof.

10. A semiconductor structure comprising:
    a substrate;
    a gate dielectric over the substrate;
    a laminated iridium silicide layer comprising:
        an iridium silicide layer over the gate dielectric;
        a silicon-rich iridium silicide layer on the iridium silicide layer; and
        an iridium-rich iridium silicide layer on the silicon-rich iridium silicide layer;
    a polysilicon layer over the iridium-rich iridium silicide layer;
    a gate spacer on sidewalls of the laminated iridium silicide layer and the polysilicon layer; and
    a source/drain region in the substrate and adjacent the gate dielectric.

11. The semiconductor structure of claim 10, wherein a silicon atomic percentage in the silicon-rich iridium silicide layer is greater than about 70 percent, and wherein an iridium atomic percentage in the iridium-rich iridium silicide layer is greater than about 70 percent.

12. The semiconductor structure of claim 10, wherein the laminated iridium silicide layer has a thickness of between about 50 Å and about 300 Å.

13. The semiconductor structure of claim 10, wherein the iridium silicide layer, the silicon-rich iridium silicide layer, and the iridium-rich iridium silicide layer each have a thickness of greater than about 10 Å.

14. A semiconductor structure comprising:
    a substrate;
    a gate dielectric of a metal-oxide-semiconductor (MOS) device over the substrate;
    a refractory metal silicide layer over the gate dielectric;
    a silicon-rich refractory metal silicide layer on the refractory metal silicide layer, wherein the refractory metal silicide layer and the silicon-rich refractory metal silicide layer comprise the same refractory metals; and
    a polysilicon layer over the silicon-rich refractory metal silicide layer.

15. The semiconductor structure of claim 14 further comprising a metal-rich refractory metal silicide layer on the silicon-rich refractory metal silicide layer.

16. The semiconductor structure of claim 14 further comprising a cap layer between the silicon-rich refractory metal silicide layer and the polysilicon layer.

17. The semiconductor structure of claim 14, wherein the refractory metals comprise iridium, molybdenum, tungsten, rhenium, tantalum, platinum, and combinations thereof.

18. The semiconductor structure of claim 14, wherein a silicon atomic percentage in the silicon-rich refractory metal silicide layer is greater than about 70 percent.

19. The semiconductor structure of claim 14, wherein the refractory metal silicide layer and the silicon-rich refractory metal silicide layer each have a thickness of between about 10 Å and about 100 Å.

20. The semiconductor structure of claim 14, wherein the gate dielectric comprises a high-k material comprising silicon nitride, silicon oxynitride, $HfO_2$, $HfZrO_x$, $HfSiO_x$, $HfSiO_x$, HfTiON, $Al_2O_3$, $HfAlO_x$, $ZrO_2$, HfZrO, HfZrON, HfTaO, HfTaTiO, and combinations thereof.

* * * * *